United States Patent [19]

Stanley

[11] Patent Number: 4,854,658
[45] Date of Patent: Aug. 8, 1989

[54] RADIATION DEFLECTOR ASSEMBLY

[75] Inventor: Ian W. Stanley, Ipswich, England

[73] Assignee: British Telecommunications public limited Company, United Kingdom

[21] Appl. No.: 80,465

[22] PCT Filed: Oct. 16, 1986

[86] PCT No.: PCT/GB86/00630

§ 371 Date: Jun. 12, 1987

§ 102(e) Date: Jun. 12, 1987

[87] PCT Pub. No.: WO87/02475

PCT Pub. Date: Apr. 23, 1987

[30] Foreign Application Priority Data

Oct. 16, 1985 [GB] United Kingdom ............... 8525458
Oct. 16, 1985 [GB] United Kingdom ............... 8525459
Oct. 16, 1985 [GB] United Kingdom ............... 8525460
Oct. 16, 1985 [GB] United Kingdom ............... 8525461
Oct. 16, 1985 [GB] United Kingdom ............... 8525462
Oct. 23, 1985 [GB] United Kingdom ............... 8526189

[51] Int. Cl.$^4$ ........................... G02B 6/26; G02B 6/42
[52] U.S. Cl. .................................................. 350/96.15
[58] Field of Search .................................... 350/96.15

[56] References Cited

U.S. PATENT DOCUMENTS

| | | | |
|---|---|---|---|
| 4,182,544 | 1/1980 | McMahon | 350/96.16 |
| 4,657,339 | 4/1987 | Fick | 350/96.15 |
| 4,669,817 | 6/1987 | Mori | 350/96.15 |
| 4,674,828 | 6/1987 | Takahashi et al. | 350/96.15 |
| 4,675,521 | 6/1987 | Sugimoto | 350/96.15 |
| 4,684,208 | 8/1987 | Ishikawa et al. | 350/96.15 |
| 4,705,349 | 11/1987 | Reedy | 350/96.15 |

OTHER PUBLICATIONS

IEEE Transactions on Microwave Theory and Techniques, vol. MTT-30, No. 10, Oct. 1982, (IEEE, New York, U.S.), M. Spitzer et al.: "Development of an Electrostatically Bonded Fiber Optic Connector Technique", pp. 1572-1576.

IBM Journal of Research and Development, vol. 24, No. 5, Sep. 1980, (Armonk, N.Y. U.S.), K. Petersen: "Silicon Torsional Scanning Mirror", pp. 631-637.

IBM Technical Disclosure Bulletin, vol. 27, No. 2, Jul. 1984, "Array Light Valve Switches Information Signals Between Fiber-Optics Signal Conductors", by M. B. Callaway et al.-pp. 1119-1120.

*Primary Examiner*—William L. Sikes
*Assistant Examiner*—Robert E. Wise
*Attorney, Agent, or Firm*—Nixon & Vanderhye

[57] ABSTRACT

A radiation deflector assembly, primarily for deflecting optical radiation, includes three waveguides mounted in V-shaped grooves (2,3,4) of a substrate (1) which are substantially coplanar. A cantilevered beam (6) integral with the substrate (1) is positioned in a cavity (5) of the substrate such that when the beam (6) is in a first position radiation passes between optical waveguides in two of the grooves (2,3) and when the beam is in a second position optical radiation passes between optical waveguides in another two of the grooves (2,4). Control electrodes (8,9) are responsive to control signals to generate a suitable electrostatic field for moving the beam (6) between the two positions.

10 Claims, 1 Drawing Sheet

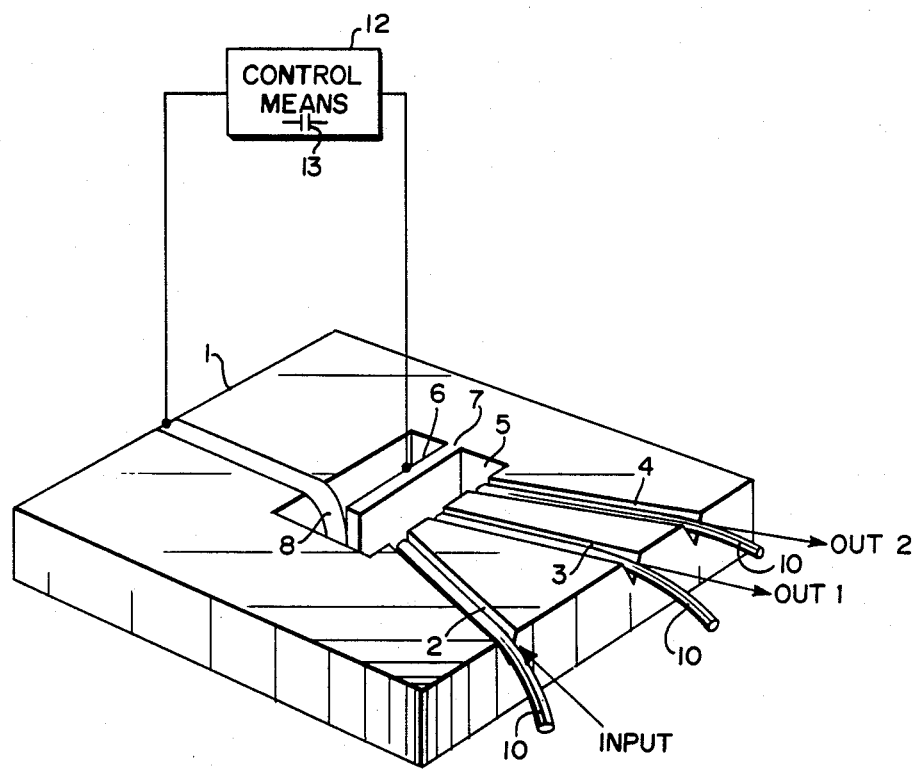

RADIATION DEFLECTOR ASSEMBLY

This application is related to my copending commonly assigned application Nos. 080,464 filed June 12, 1987 and 080,469 filed June 12, 1987.

The invention relates to radiation deflector assemblies of the kind comprising at least three radiation waveguides; a controllable radiation deflector positioned such that when the deflector is in a first position radiation passes between one combination of two of the waveguides, and when the deflector is in a second position radiation passes between another combination of two of the waveguides; and control means responsive to control signals for controlling the position of the deflector. Such assemblies are hereinafter referred to as of the kind described.

Radiation deflector assemblies of the kind described find particular application as switches in optical transmission systems. IBM Technical Disclosure Bulletin Vol 27, No. 2 of July 1984 (pages 11-12) describes a solid-state array of mirrors positioned beneath three groups of optical fibres. In a relaxed position, optical radiation impinging on the mirrors from one group of fibres is reflected towards another group. When the mirrors are in a deflected position, optical radiation is instead reflected towards the third group of fibres.

The major problem with this arrangement is that it is difficult accurately to align the optical fibres with the mirrors. Alignment is important when large arrays of mirrors are concerned so as to maximise the number of mirrors per unit area.

In accordance with the present invention, a radiation deflector assembly of the kind described is characterised in that the waveguides and the deflector are mounted in a common substrate.

The invention deals with the alignment problem by mounting both the waveguides and the deflector in the same substrate.

Preferably, the waveguides are substantially coplanar, and conveniently the direction of movement of the deflector is in substantially the same plane as the plane of the waveguides. In alternative arrangements, however, the waveguides may extend in different planes.

The invention is particularly suitable where the substrate comprises a single crystal of for example silicon, since anisotropic etching techniques may be used to define grooves of the same or different depths into which the waveguides are mounted.

The invention is particularly suitable for deflecting radiation in the optical waveband and typically a large number of radiation deflector assemblies according to the invention will be assembled together to constitute an optical switch array.

In some arrangements, the deflector may comprise a piston member which moves to and fro between the first and second positions. Preferably, however, the deflector comprises a cantilevered arm which is controlled to pivot between the first and second positions.

It is particularly convenient if the deflector is integrally formed with the substrate. This can be achieved using conventional etching techniques or laser etching technology.

Preferably, the deflector is adapted to deflect the radiation in both the first and second positions although in some examples, radiation could pass directly from one waveguide to another when the deflector is in the first position and be deflected towards another waveguide when the deflector is in the second position.

The deflector will typically comprise a radiation reflector but other deflectors are possible such as a refractor or diffractor.

In some examples, the waveguides could be formed by diffusing a suitable material into the substrate but conveniently each waveguide is mounted in a groove formed in a surface of the substrate, typically a V-shaped groove.

As has previously been mentioned, the substrate may comprise silicon but other substrate materials are possible such as silica or lithium niobate or III-V compounds such as gallium arsenide.

The position of the deflector can be controlled using conventional electrostatic techniques or by thermal methods similar to those described in my copending U.S. patent application 080,469 of even date entitled "Movable Member Mounting".

An example of an optical reflection assembly according to the invention for use in an optical switch array will now be described with reference to the accompanying drawing which is a schematic perspective view of the assembly.

The optical element or assembly shown in the drawing includes a substrate comprising a single crystal silicon slice 1 in the upper surface of which three V-shaped grooves 2-4 have been etched using an anisotropic masking and etching technique. The grooves 2-4 all have substantially the same depth and are effectively coplanar. Each groove 2-4 terminates in a cavity 5 formed in the substrate 1. Monomode optical fibres 10 are positioned in each of the grooves 2-4 with their ends facing into the cavity 5.

A cantilevered, vertically hinged silicon beam 6 is positioned in the cavity 5 and is integrally formed with the remainder of the substrate 1. The beam 6 acts as an optical reflector.

The beam can pivot about its end—between first and second positions in response to an electrostatic field generated by a pair of electrodes, one of which 8 is mounted to the substrate and the other of which is mounted to the facing surface of the beam 6. If the beam is at ground potential, the second electrode is not required. The electrodes are connected to electrical control apparatus 12 including a power source 13.

In its first position, the reflector 6 reflects optical radiation passing along the optical fibre in the groove 2 into the optical fibre in the groove 3. In its second position, optical radiation impinging on the reflector 6 from the fibre in the groove 2 is reflected into the fibre in the groove 4. The element shown in the drawing can thus be used as an optical switch to switch incoming radiation in the optical fibre in the groove 2 into either the optical fibre in the groove 3 or the optical fibre in the groove 4.

I claim:

1. A radiation deflector assembly comprising at least three radiation waveguides; a controllable radiation reflector positioned such that when the reflector is in a first position radiation passes between one combination of two of the waveguides and when the reflector is in a second position radiation passes between another combination of two of the waveguides; and control means responsive to control signals for controlling the position of the reflector characterised in that:

the reflector is integrally formed with a substrate;

the waveguides are in a fixed position relative to the substrate; and radiation passing between a combination of two of the waveguides, exists one waveguide prior to being reflected to enter another waveguide.

2. An assembly according to claim 1, wherein the radiation waveguides are substantially coplanar.

3. An assembly according to claim 1, wherein each waveguide comprises a waveguide member mounted in a respective groove formed in the substrate.

4. As assembly according to claim 1 or claim 3, wherein the reflector comprises a cantilevered arm.

5. An assembly according to claim 1 or claim 3, wherein the waveguides and reflector include means to guide and reflect optical radiation respectively.

6. An assembly according to claim 1 or claim 3, wherein the substrate in a single crystal.

7. An electro-optic switch structure for controllably switching optical radiation from an end of a first optical waveguide into the ends of at least a second and third optical waveguide, said structure comprising;

a single unitary substrate having integrally formed thereon (a) at least first, second and third grooves for holding said first, second and third waveguides respectively in predetermined fixed positions within the substrate;

(b) a movable optical radiation reflector controllably positionable with respect to said substrate to intercept optical radiation emanating from one of said waveguides and to redirect such radiation onto the free end of another of said waveguides; and (c) control electrodes located to effect controlled movement of said radiation deflector in response to applied electrical signals.

8. An electro-optic switch structure as in claim 7 wherein said substrate is a single silicon chip in which said grooves and reflector are formed by selective silicon etching processes.

9. An electro-optic switch structure as in claim 7 wherein said grooves are V-shaped and lead from an outside edge of said substrate into a central cavity in which cavity the reflector is formed.

10. An electro-optic switch structure as in claim 9 wherein said reflector is a cantilevered reflector attached at one cantilevered edge to an inside wall of said central cavity.

* * * * *